(12) United States Patent
Kato et al.

(10) Patent No.: US 6,246,097 B1
(45) Date of Patent: Jun. 12, 2001

(54) SEMICONDUCTOR PHOTODETECTOR (75) Inventors: Masanobu Kato; Ryozo Furukawa, both of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/187,001

(22) Filed: Nov. 6, 1998

(30) Foreign Application Priority Data

Mar. 20, 1998 (JP) .................................................. 10-092805

(51) Int. Cl.[7] .............................................. H01L 31/0232
(52) U.S. Cl. ............................................ 257/432; 257/466
(58) Field of Search ...................................... 257/432, 466

(56) References Cited

U.S. PATENT DOCUMENTS

| | | | |
|---|---|---|---|
| 4,294,510 | * 10/1981 | Chappell | 257/432 |
| 4,800,569 | * 1/1989 | Azad | 372/99 |
| 4,897,711 | * 1/1990 | Blonder | 257/432 |
| 4,977,569 | 12/1990 | Furukawa et al. . | |
| 5,017,986 | * 5/1991 | Rouse | 257/432 |
| 5,218,223 | * 6/1993 | Spaeth | 257/437 |
| 5,357,122 | * 10/1994 | Okubora | 257/432 |
| 5,485,021 | * 1/1996 | Abe | 257/432 |

* cited by examiner

Primary Examiner—Jerome Jackson, Jr.
(74) Attorney, Agent, or Firm—Wenderoth, Lind Ponack, L.L.P.

(57) ABSTRACT

At a semiconductor photodetector 100, a photodetection portion 120 is formed on a first substrate surface 110a of a substrate 110. In addition, a recess 110d is formed at a second substrate surface 110b of the substrate 110 which faces opposite the first substrate surface 110a. This recessed portion 110d is formed as a wedge-type V-shaped groove with a forward mesa surface formed at a front surface thereof, and is formed approximately parallel to a side photodetection surface 110c of the substrate 110 which is approximately perpendicular to the second substrate surface 110b. A total reflection film is coated on the front surface of the recess 110d. In the semiconductor photodetector 100 structured as described above, an incoming light P1 entering through the side photodetection surface 110c is reflected at the recess 110d to enter the photodetection portion 120 from the side where the substrate 110 is provided. As a result, the incoming light P1 is sensed at the photodetection portion 120.

11 Claims, 11 Drawing Sheets

SEMICONDUCTOR PHOTODETECTOR

BACKGROUND OF THE INVENTION

The present invention relates to a semiconductor photodetector (hereafter referred to in abbreviation as "PD").

In recent years, side-entry type PDs with light to be detected entering in the horizontal direction relative to the substrate have been proposed as semiconductor photodetectors that are well suited for flat mounting modules. Generally speaking, the main objective of flat mounting modules is reduction of production cost, and implementation of non-alignment (passive alignment) mounting by using inexpensive optical elements.

In passive alignment mounting, precision alignment for perfectly matching the optical axes of the individual optical elements to be mounted is not implemented. As a result, a semiconductor photodetector to be employed in a flat mounting module must demonstrate outstanding tolerance characteristics so that sufficient sensitivity is assured even if misalignment of optical axes occurs within the mounting accuracy range of the passive alignment mounting method.

It is to be noted that tolerance characteristics in this context refer to characteristics representing the optical axis misalignment tolerance range over which a sufficient degree of photodetection sensitivity is achieved, and under normal circumstances, different characteristics manifest depending upon the direction in which the optical axis misalignment is measured. In the following explanation and in the attached drawings, a coordinate system is employed to explain the tolerance characteristics of semiconductor photodetectors. In the coordinate system, the X direction represents the direction of the width of the substrate, the Y direction represents the direction of the thickness of the substrate and the Z direction represents the direction of the depth of the substrate, relative to the direction in which light enters.

Generally speaking, a side-entry type PD is provided with a laminated body adopting a structure achieved by directly or indirectly sandwiching a light absorption layer with complementary type semiconductor layers from a vertical direction, with the laminated body functioning as a photodetection portion. In other words, in a side-entry type PD, light is detected by extracting to the outside an electrical charge generated by the entry of light into the light absorption layer of the laminated body via the complementary semiconductor layers.

Side-entry type PDs in the prior art include, for instance, (A) cleavage photodetection plane PDs and (B) light refraction type mesa photodetection surface PDs.

(A) A cleavage photodetection plane PD is a side-entry type PD that uses a cleavage plane formed at a side surface of the laminated body as a photodetection surface.

Figure 14:
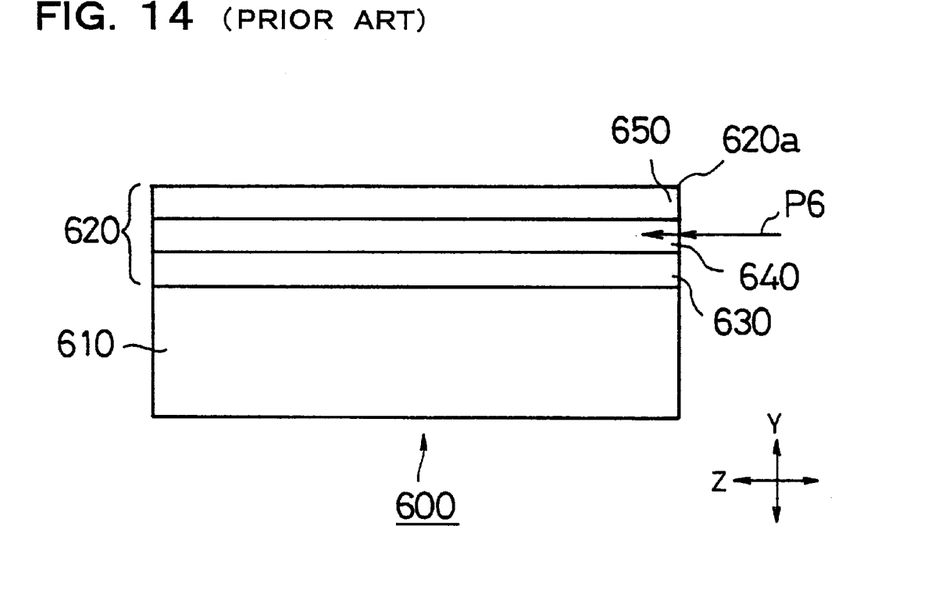
FIG. 14 is a schematic cross section illustrating a semiconductor photodetector in the prior art.

(1) Cleavage photodetection plane PDs in the prior art include a semiconductor photodetector 600 adopting a simple pin structure illustrated in FIG. 14. FIG. 14 is a cross section in the Y-Z direction that illustrates the schematic structure of the semiconductor photodetector 600 in the prior art. It is to be noted that the term simple pin structure is used to describe a laminated body with a pin junction in which the light absorption layer is directly sandwiched by complementary semiconductor layers.

As illustrated in FIG. 14, the semiconductor photodetector 600 in the prior art adopts a structure in which a laminated body 620 having a cleavage photodetection plane 620a formed at a side surface thereof is provided on, for instance, an n$^+$-InP substrate 610. In addition, the laminated body 620 is formed by sequentially laminating a buffer layer 630, a light absorption layer 640 and a cap layer 650 on the substrate 610.

During the process for manufacturing the semiconductor photodetector 600 in the prior art, the buffer layer 630 which is equivalent to a semiconductor layer on the substrate side is formed by, for instance, epitaxially growing an n-InP layer on the substrate 610. In addition, the light absorption layer 640 is formed by, for instance, epitaxially growing an n$^-$-InGaAsP layer on the buffer layer 630. The cap layer 650 which is equivalent to a semiconductor layer is formed by, for instance, epitaxially growing a p$^+$-InP layer on the light absorption layer 640.

In the semiconductor photodetector 600 in the prior art adopting this structure, incoming light P6 entering through the cleavage photodetection plane 620a is not wave-guided to the inside of the laminated body 620. In other words, with the semiconductor photodetector 600, in which the incoming light P6 is completely absorbed at the light absorption layer 640 in the vicinity of the cleavage photodetection plane 620a, degradation of the cutoff frequency due to a local increase in the electrical charge density tends to occur.

(2) An example of cleavage photodetection plane PDs with cutoff frequency characteristics superior to those of the cleavage photodetection plane PDs having the simple pin structure described above is a side-entry type PD adopting a waveguide structure disclosed by M. Shishikura et al. In Electron. Lett. vol. 32, No. 20, p1882–1883, 1996. It is to be noted that the waveguide structure in this context refers to a structure having a light guide layer for guiding light into the inside of the laminated body between the light absorption layer and the semiconductor layer, i.e., a laminated structure in which the light absorption layer is indirectly sandwiched by semiconductor layers.

Figure 15:
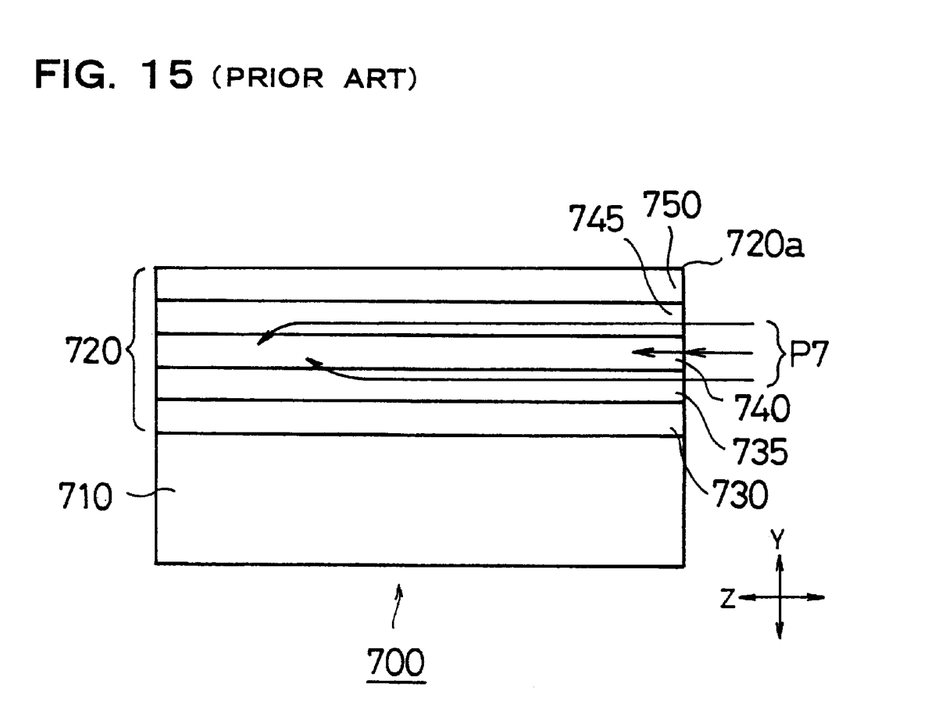
FIG. 15 is a schematic cross section illustrating another semiconductor photodetector in the prior art.

Now, a side-entry type PD adopting the waveguide structure in the prior art is explained in reference to a semiconductor photodetector 700 illustrated in FIG. 15. It is to be noted that FIG. 15 is a cross section in the Y-Z direction illustrating a schematic structure of the semiconductor photodetector 700.

As illustrated in FIG. 15, the semiconductor photodetector 700 in the prior art adopts a structure achieved by forming a laminated body 720 having a cleavage photodetection plane 720a formed at a side surface thereof on, for instance, an n$^+$-InP substrate 710. The laminated body 720 is formed by sequentially laminating a buffer layer 730, a first light guide layer 735, a light absorption layer 740, a second light guide layer 745 and a cap layer 750 on the substrate 710.

During the process for manufacturing the semiconductor photodetector 700, the buffer layer 730 which is equivalent to a semiconductor layer, is formed by, for instance, epitaxially growing an n-InP layer on the substrate 710. In addition, the first light guide layer 735 is formed by, for instance, epitaxially growing an n-InGaAsP layer on the buffer layer 730. The light absorption layer 740 is formed by, for instance, epitaxially growing an n$^-$-InGaAsP layer on the first light guide layer 735.

Furthermore, in the semiconductor photodetector 700, the second light guide layer 745 is formed by, for instance, epitaxially growing an n-InGaAsP layer on the light absorption layer 740. The cap layer 750 which is equivalent to a semiconductor layer is formed by, for instance, epitaxially growing a p$^+$-InP layer on the second light guide layer 745.

In the semiconductor photodetector 700 structured as described above, an incoming light P7 is wave-guided to the inside of the laminated body 720 by the first light guide layer 735 and the second light guide layer 745 unlike in the semiconductor photodetector 600 adopting the pin structure illustrated in FIG. 14. Therefore, degradation of the cutoff frequency due to a local increase in the electrical charge density does not occur so readily. As a result, the cleavage photodetection plane PD adopting the waveguide structure achieves outstanding characteristics with respect to the cutoff frequency, and is thus commonly employed as a side-entry type PD in the prior art together with the light refraction type mesa photodetection surface PD which is to be explained below.

Now, the tolerance characteristics in the direction of the X axis at a cleavage photodetection plane PD are determined depending exclusively upon the shape of the laminated body constituting the photodetection portion. In addition, the tolerance characteristics in the direction of the Y axis are determined, exclusively depending upon the thicknesses of the individual layers in the laminated body. Furthermore, the tolerance characteristics in the direction of the Z axis are determined, depending upon both the shape of the laminated body and the thicknesses of the individual layers in the laminated body. Thus, in a cleavage photodetection plane PD for application in a flat mounting module, it is necessary to increase the thicknesses of the individual layers constituting the laminated body in order to improve the tolerance characteristics in the direction of the Y axis and the tolerance characteristics in the direction of the Z axis.

Normally, the production costs of a wafer formed by epitaxially growing individual layers increase in proportion to the total number of layers to be epitaxially grown and the total thickness of the laminated structure, resulting in an increase in the prime cost. Consequently, a cleavage photodetection plane PD achieving good tolerance characteristics will be expensive. Particularly, a waveguide type cleavage photodetection plane PD, in which the total number of layers to be epitaxially grown is larger than that in a simple pin structure, is even more expensive.

(B) Next, another side-entry type PD in the prior art, i.e., a light refraction type mesa photodetection surface PD is explained. The light refraction type mesa photodetection surface PD, which is a side-entry type PD having a mesa surface formed to constitute a photodetection surface at a side surface of a substrate, guides light from the substrate to the laminated body by utilizing the refraction of the light at the mesa surface. Namely, in the light refraction type mesa photodetection surface PD, light enters the surface of the light absorption layer toward the substrate, unlike in the cleavage photodetection plane PD described earlier.

As a result, the size of the area over which light enters at the light absorption layer increases so that any local increase in the electrical charge density at the light absorption layer can be prevented without having to employ the waveguide structure for the photodetection portion. Thus, the light refraction type mesa photodetection surface PD simply requires that a photodetection portion adopting the simple pin structure be employed, thereby achieving both a reduction in the initial cost and prevention of degradation in the cutoff frequency.

Furthermore, since the size of the area over which light enters at the light absorption layer is increased, the required photodetection sensitivity is assured even if the position at which light enters the mesa surface is offset to a degree. Consequently, the light refraction type mesa photodetection surface PD normally achieves better tolerance characteristics than the cleavage photodetection plane PD.

Mesa photodetection surface PDs in the prior art include a reverse mesa photodetection surface PD using a reverse mesa surface as its photodetection surface and a forward photodetection surface PD using a forward mesa surface as its photodetection surface.

(1) The reverse mesa surface in this context refers to an inclined surface (mesa surface) formed through etching to face toward the inside of the substrate. The reverse mesa surface may be formed at a side wall in the vicinity of the entrance to a groove with a barrel-shaped cross section formed on a substrate through wet etching implemented by utilizing anisotropy between the direction of the crystal and the direction in which the etching advances.

Reverse mesa photodetection surface PDs in the prior art include, for instance, that disclosed by H. Fukuno et al. in Electron. Lett vol. 32, No. 25, p2346–2348, 1996.

At a reverse mesa photodetection surface PD, the size of the reverse mesa surface must be large in order to improve the tolerance characteristics with respect to misalignment. Normally, a diffusion rate controlled etching solution is used on an InP substrate which is employed as a substrate for optical elements. Since, in the barrel-shaped groove where the reverse mesa surface is formed (the reverse mesa portion), the etching solution that has entered the groove is not readily diffused, etching does not ultimately progress in the direction of the depth of the groove and only the entrance of the groove expands even if the object is to deepen the groove. Thus, it is extremely difficult to grow a reverse mesa surface over a large area. Under normal circumstances, irregular increases and decreases in the size of the reverse mesa surface result.

In addition, when the depth of the barrel-shaped groove is increased to form a large reverse mesa surface to improve the tolerance characteristics, it becomes very difficult to remove the wax which enters the groove during a polishing step performed at the substrate rear surface in order to achieve a specific chip thickness. Consequently, the wax often remains adhered to the reverse mesa surface which constitutes the photodetection surface in a reverse mesa photodetection surface PD. This adhesion which often results in degradation in photodetection efficiency.

(2) With another type of light refraction type mesa photodetection surface PD, i. e. , a beveled entry type PD (forward mesa photodetection surface PD), the photodetection surface can be machined and formed with a greater degree of ease compared to the reverse mesa photodetection surface PD described above. It is to be noted that the forward mesa surface in this context refers to a mesa surface formed toward the outside of the substrate as opposed to the case with the reverse mesa surface. Beveled entry type PDs in the prior art include, for instance, the photodetector disclosed by Norimatsu et al. in the 1996 Shingakukai Society Convention, C-218. This beveled entry type PD in the prior art is now explained in reference to FIG. 16 which illustrates a semiconductor photodetector 800.

Figure 16:
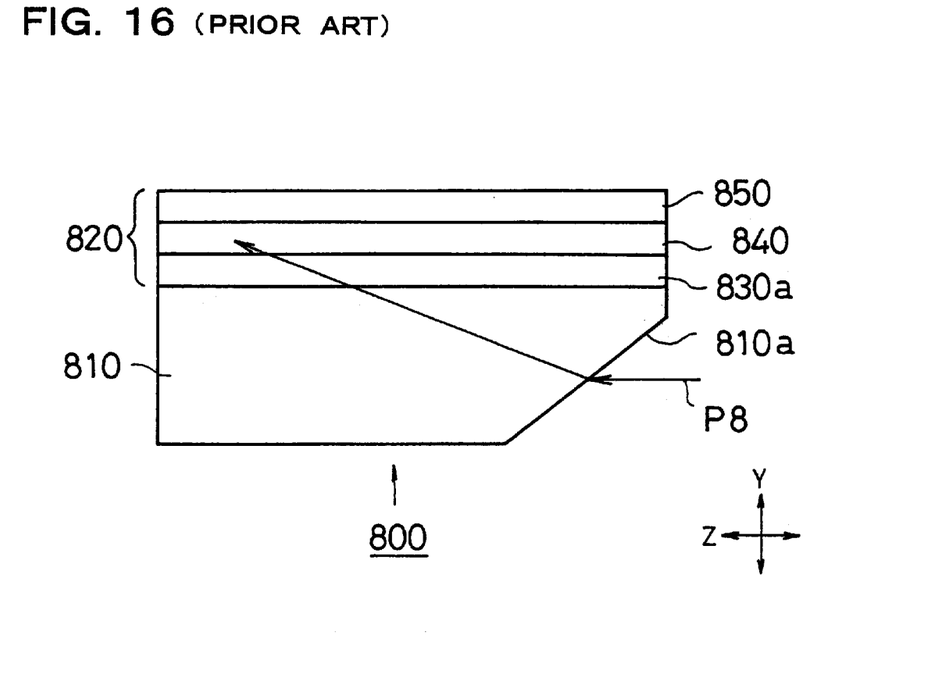
FIG. 16 is a schematic cross section illustrating yet another semiconductor photodetector in the prior art.

It is to be noted that FIG. 16, which is referred to in the explanation of the semiconductor photodetector 800 is a cross section in the Y-Z direction illustrating a schematic structure of the semiconductor photodetector 800. In addition, FIGS. 17–19 present cross sections in the Y-Z direction illustrating schematic structures of a semiconductor photodetector 900 achieved by reducing the size of the photodetection portion in the semiconductor photodetector 800 to reduce the junction capacity.

As illustrated in FIG. 16, a laminated body 820 adopting a pin structure, which is equivalent of a photodetection portion, is formed on a substrate 810 with a forward mesa surface 810a formed at a side surface thereof. At the semiconductor photodetector 800, incoming light P8 entering the forward mesa surface 810a is refracted at the forward mesa surface 810a and is then transmitted diagonally through the substrate 810. Then, the incoming light P8 enters a light absorption layer 840 via a buffer layer 830 to be absorbed at the light absorption layer 840.

In the semiconductor photodetector 800 in the prior art, the angle of incidence of light entering the laminated body 820 is dependent upon the inclination of the forward mesa surface 810a relative to the rear surface of the substrate 810, which is determined by the etching solution used and the refraction factor of the substrate 810 determined by the material constituting the substrate 810. As indicated in the publication mentioned above, in which the light which has been refracted at the forward mesa surface advances at approximately 25.12 degrees relative to the direction of entry, the angle of incidence of light into the laminated body 820 is normally small.

Figure 17:
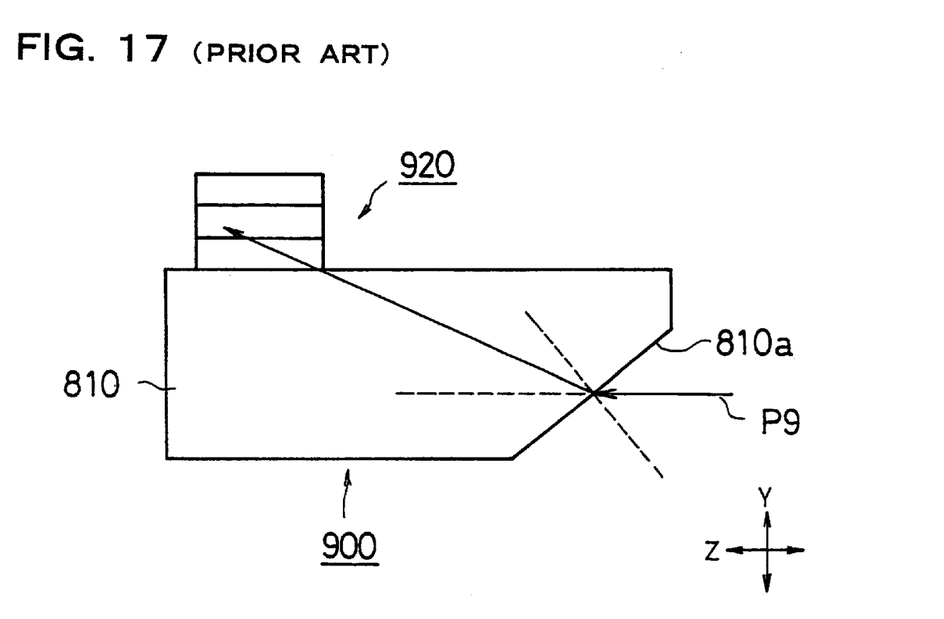
FIG. 17 is a schematic cross section illustrating yet another semiconductor photodetector in the prior art.
Figure 18:
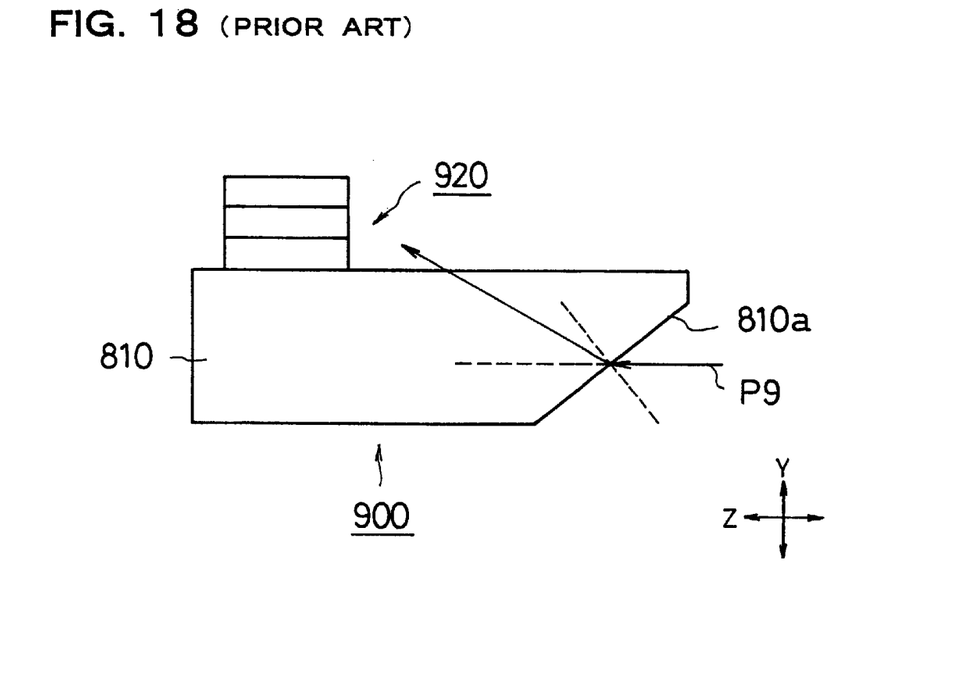
FIG. 18 illustrates problems of the semiconductor photodetector in the prior art shown in FIG. 17.
Figure 19:
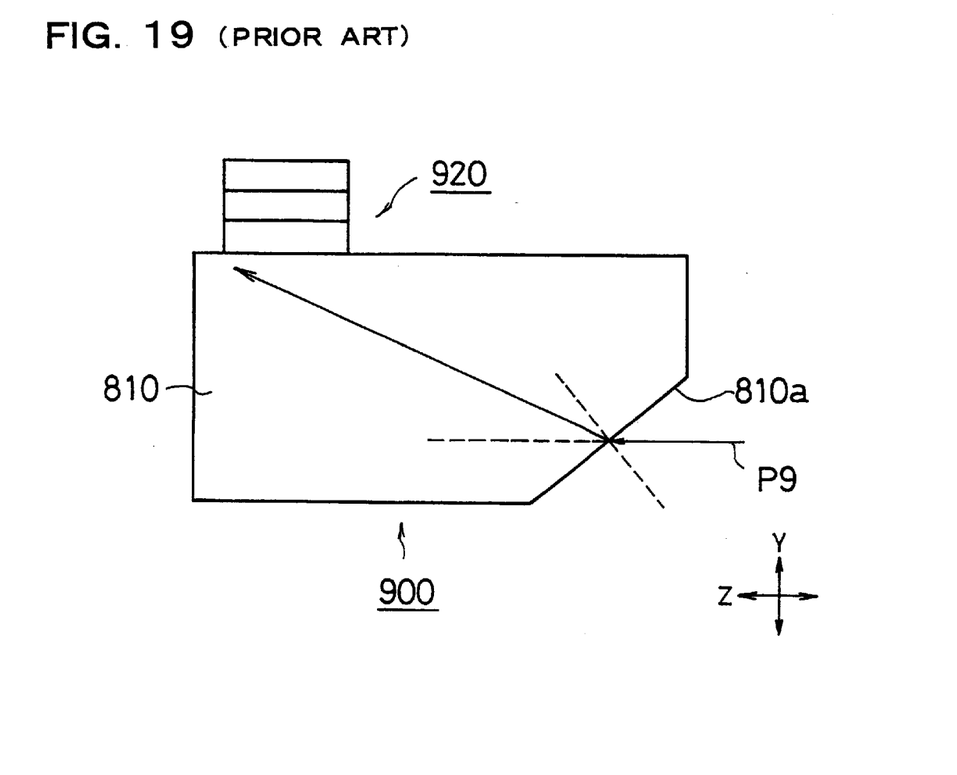
FIG. 19 also illustrates problems of the semiconductor photodetector in the prior art shown in FIG. 17.

As a result, if the semiconductor photodetector 800 is formed as a semiconductor photodetector 900 illustrated in FIG. 17 in order to improve its cutoff frequency and if a polishing error occurs while polishing the rear surface of the substrate 820, incoming light P9 will not enter the laminated body 920 constituting the photodetection portion, as illustrated in FIG. 18 or 19.

As has been explained, it is obvious that it is difficult to achieve a further improvement in the cutoff frequency with the beveled entry type PD since its photodetection portion must be formed large due to the consideration of possible polishing error at the substrate rear surface.

SUMMARY OF THE INVENTION

An object of the present invention, which has been completed by addressing the problems of the semiconductor photodetectors in the prior art discussed above, is to provide a new and improved semiconductor photodetector with which a reduction in the production costs, an improvement in the tolerance characteristics and a further improvement in regard to the cutoff frequency can all be achieved at once.

Another object of the present invention is to provide a new and improved semiconductor photodetector which affords a higher degree of freedom in design.

In order to achieve the objects described above, the present invention adopts a structure comprising a substrate having a first substrate surface and a second substrate surface facing opposite each other with light transmitted between the first substrate surface and the second substrate surface, a photodetection portion formed on the first substrate surface of the substrate to sense light and a recess formed on the second substrate surface for reflecting light transmitted through the substrate toward the photodetection portion.

In the semiconductor photodetector structured as described above, the angle of incidence of light entering the photodetection portion can be adjusted freely by adjusting the position and the shape of the recess, which can be set independently of each other, to change the direction in which the light transmitted through the substrate is reflected. Thus, according to the present invention, a higher degree of freedom is afforded in designing a semiconductor photodetector so that a semiconductor photodetector that can be adopted with ease in an optical apparatus in which a plurality of optical elements are formed or provided on one substrate such as a optical integrated circuit, a flat mounting optical module or the like is provided.

In addition, with the semiconductor photodetector according to the present invention, by setting the direction in which light enters into the photodetection portion closer to the direction of the normal line of the first substrate surface, the degree of relative misalignment of light entry at the photodetection portion in the direction of the first substrate surface occurring due to an alignment error can be reduced. Consequently, an improvement in the tolerance characteristics of the semiconductor photodetector is achieved so as to realize miniaturization of the photodetection portion.

Also, it is desirable to adopt a simple pin structure in the photodetection portion, achieved by sandwiching a light absorption layer, which absorbs incoming light, with a first semiconductor layer and a second semiconductor layer that are complementary to each other to reduce the production costs.

Furthermore, by adopting a structure provided with a photodetection portion formed projecting out from the first substrate surface, any adverse effect of stray light caused by light that goes astray of the photodetection portion can be eliminated. Thus, this structure achieves a reduction in the degree of degradation of sensitivity at the photodetection portion.

Moreover, by adopting a structure in which a light entry surface formed approximately perpendicular to the second substrate surface is provided at the substrate of the semiconductor photodetector, a semiconductor photodetector which is suited for application in a flat mounting module is provided. In addition, by constituting the recess as a groove, the quantity of light picked up by the recess increases, to improve the tolerance characteristics in the direction of the length of the recess.

It is to be noted that reflection of light at the recess may be achieved through a structure having a light reflecting film formed at the recess. Furthermore, the recess may be constituted by providing a forward mesa surface having a light reflecting film or by providing a reverse mesa surface having a light reflecting film.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

The following is a detailed explanation of a preferred embodiment of a semiconductor photodetector that adopts the present invention in reference to the attached drawings. It is to be noted that in the following explanation and the attached drawings, the same reference numbers are assigned to components having approximately identical functions and structural features to eliminate the necessity for repeated explanation thereof.

Figure 1:
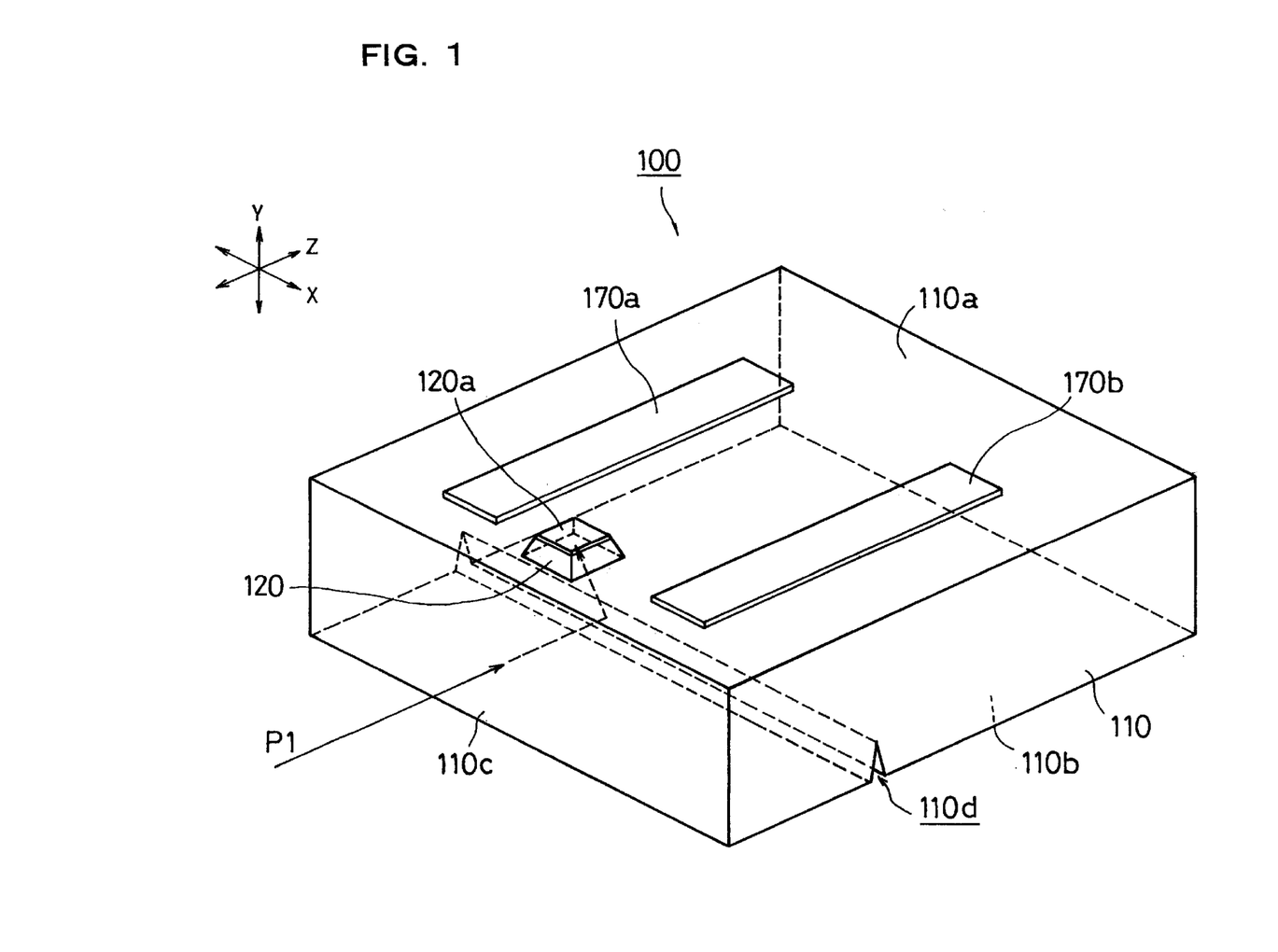
FIG. 1 is a perspective view illustrating a schematic structure of a semiconductor photodetector in which the present invention may be adopted.

(A) (1) First, the structure of a semiconductor photodetector 100 in the first embodiment is explained in reference to FIGS. 1–6. It is to be noted that FIG. 1 is a perspective view illustrating a schematic structure of the semiconductor photodetector 100, and that FIGS. 2–6 sequentially illustrate the steps for manufacturing the semiconductor photodetector 100.

As illustrated in FIG. 1, the semiconductor photodetector 100 in the embodiment adopts a structure in which a photodetection portion 120, a first electrode 170a and a second electrode 170b are formed on a first substrate surface 110a of a substrate 110. In this semiconductor photodetector 100, the substrate 110 is provided with a second substrate surface 110b facing opposite the first substrate surface 110a and a side photodetection surface 110c which is approximately perpendicular to the first substrate surface 110a and the second substrate surface 110b.

At the second substrate surface 110b of the substrate 110, a recess 110d is formed approximately parallel to the side photodetection surface 110c which is equivalent to a light entry surface. The recess 110d, which is formed as a wedge type V-shaped groove with a forward mesa surface formed at a front surface thereof, reflects incoming light P1 entering through the side photodetection surface (light entry surface) 110c toward the photodetection portion formed on the first substrate surface 110a. In this structure, the depth and the forming position of the recess 110d may be determined in accordance with optical geometry by taking into consideration various physical parameters with respect to the semiconductor photodetector 100 to ensure that the incoming light P1 is reflected at a specific angle. It is to be noted that the physical parameters that should be taken into consideration when determining the depth and forming position of the recess 110d include, for instance, the thickness of the substrate 110, the refraction factor of a substance constituting the substrate 110, the refraction factor of the substance constituting the photodetection portion and the like.

Figure 2:
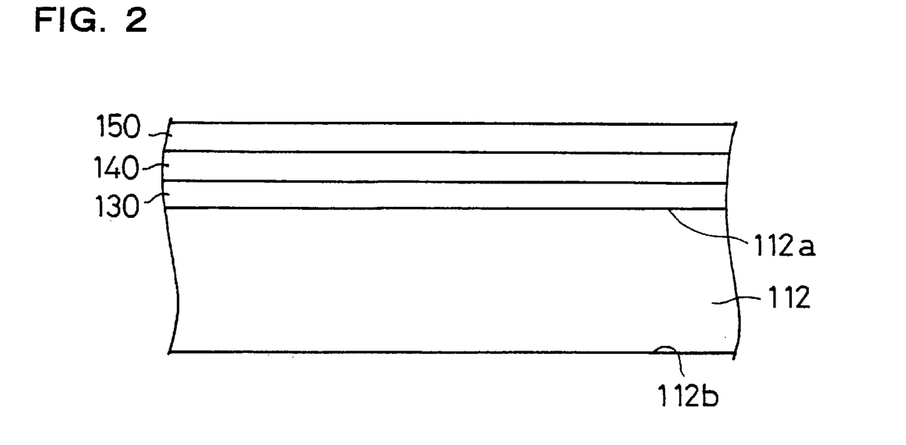
FIG. 2 illustrates a first step for manufacturing the semiconductor photodetector shown in FIG. 1.

When manufacturing the semiconductor photodetector 110 having the schematic structure described above, a buffer layer 130 is formed by, for instance, epitaxially growing an n-InP layer on a first substrate surface 112a of a substrate 112 through the crystal growth method, as illustrated in FIG. 2 in the first step. It is to be noted that the substrate 112 may be constituted of, for instance, a semi-insulating material such as Si-InP.

In addition, a light absorption layer 140 is formed by, for instance, epitaxially growing an $n^-$-InGaAsP layer on the buffer layer 130 through the crystal growth method. Furthermore, a cap layer 150 is formed by, for instance, epitaxially growing a $p^+$-InP layer on the light absorption layer 140 through the crystal growth method.

Through this process, the substrate 112 ultimately constitutes the substrate 110 illustrated in FIG. 1. Thus, the first substrate surface 112a of the substrate 112 ultimately constitutes the first substrate surface 110a illustrated in FIG. 1 and a second substrate surface 112b facing opposite the first substrate surface 112a ultimately constitutes the second substrate surface 110b illustrated in FIG. 1.

Figure 3:
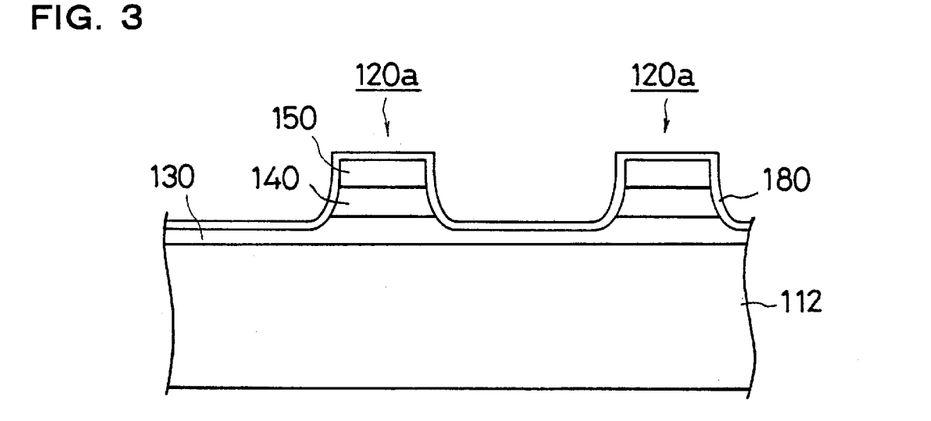
FIG. 3 illustrates the manufacturing step that follows the manufacturing step shown in FIG. 2.

Next, as illustrated in FIG. 3, etching is performed using an etching solution with which both the cap layer 150 and the light absorption layer 140 can be etched while leaving part of the laminated structure unetched. Through this etching, a laminated body 120a, which projects out alone on the first substrate surface 110a is formed. The laminated body 120a ultimately constitutes the photodetection portion 120 illustrated in FIG. 1.

During this step illustrated in FIG. 3, a bromine etching solution such as an etching solution satisfying $HBr:H_2O_2:HCl:H_2O=50:10:100:100$ may be used.

After the laminated body 120a is formed as described above, the laminated body 120a and the front surface of the exposed buffer layer 130 are coated with an insulating film 180 of, for instance, $Si_3N_4$.

Figure 4:
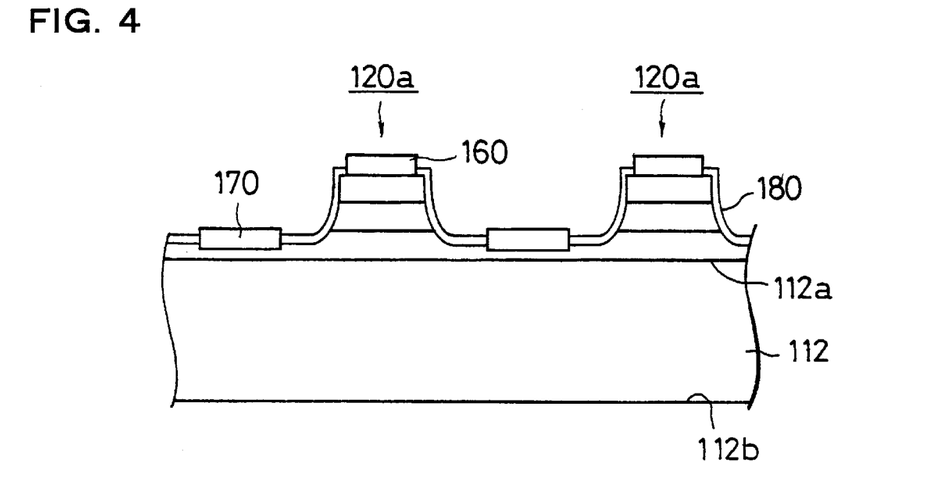
FIG. 4 illustrates the manufacturing step that follows the manufacturing step shown in FIG. 3.

Next, as illustrated in FIG. 4, the insulating film 180 at the top of the laminated body 120a is removed and a p-electrode pad 160 of, for instance, Au/AuZn+Ti/Pt/Au is mounted. In addition, the insulating film 180 is also removed from a portion of the buffer layer to mount n-electrode pads 170 of, for instance, AuGeNi/Au+Ti/Pt/Au. These n-electrode pads 170 ultimately constitute the first electrode 170a and the second electrode 170b illustrated in FIG. 1.

Figure 5:
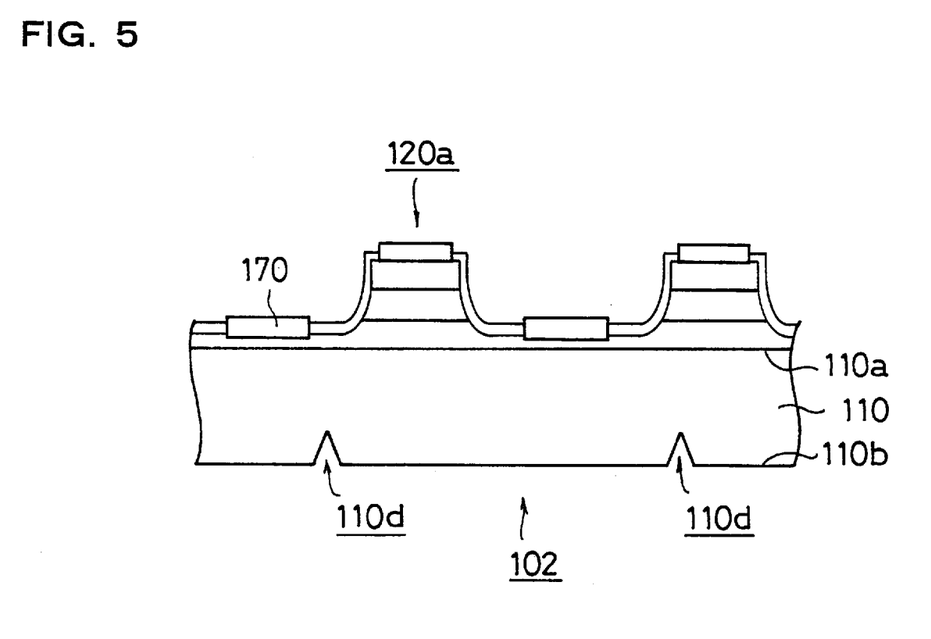
FIG. 5 illustrates the manufacturing step that follows the manufacturing step shown in FIG. 4.

In the next step, as illustrated in FIG. 5, the second substrate surface 112b is polished to achieve a specific thickness for the substrate 112. Then, an etching groove 112d is formed at the second substrate surface 112b by using an etching solution satisfying, for instance, $HBr:H_2O_2:HCl:H_2O=50:10:100:100$.

Also, a total reflection film is coated onto the front surface of the etching groove 112d that has been formed. This coating may be implemented by vapor depositing a metal. More specifically, Cr/Au or the like, for instance, may be vapor deposited. It is to be noted that the etching groove 112d ultimately constitutes the recess 110d in the embodiment illustrated in FIG. 1.

Figure 6:
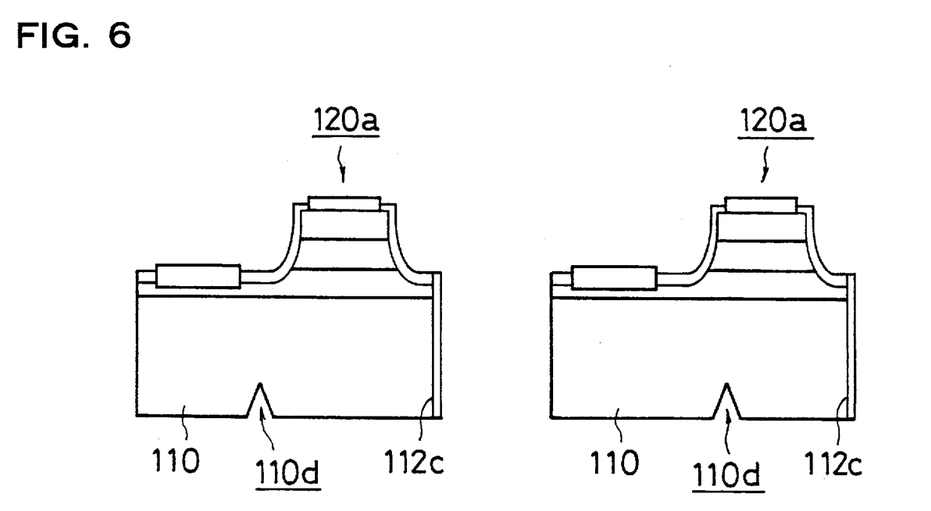
FIG. 6 illustrates the manufacturing step that follows the manufacturing step shown in FIG. 5.

Next, a wafer 102 thus formed is cut into bars as illustrated in FIG. 6, and a reflection prevention film is coated onto each cleavage plane 112c thus formed. A reflection prevention film of $Si_3N_4$ having a thickness of, for instance, lambda/4n may be employed for this coating. In this context, the lambda represents the wavelength of incoming light and n indicates the refraction factor of the $Si_3N_4$ film. It is to be noted that the cleavage planes 112c constitute the side photodetection surface 110c illustrated in FIG. 1.

Through the process described above, the one chip type semiconductor photodetector 100 in the embodiment illustrated in FIG. 1 is formed.

Now, the operation of the semiconductor photodetector 100 constituted as described above is explained in reference to FIG. 7. It is to be noted that FIG. 7 is a schematic cross section to be used to explain the operation of the semiconductor photodetector 100 in the embodiment.

Figure 7:
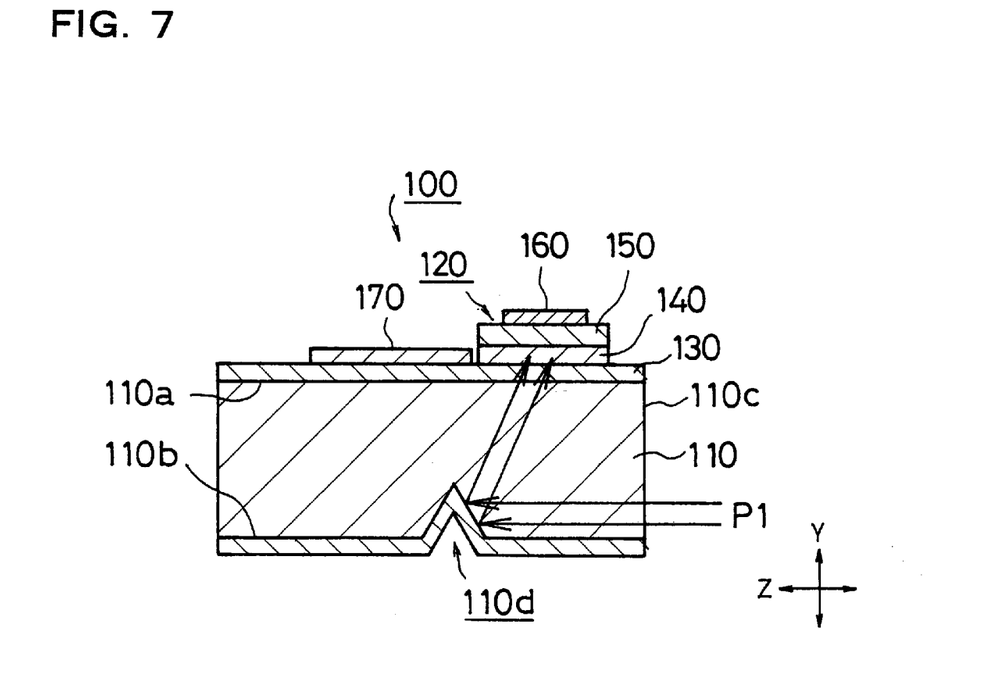
FIG. 7 is a cross section schematically illustrating the operation of the semiconductor photodetector shown in FIG. 1.

As FIG. 7 illustrates, at the semiconductor photodetector 100, incoming light P1 entering through the side photodetection surface 110c into the substrate 110 is reflected by the recess 110d formed at the second substrate surface 110b toward the photodetection portion 120 formed on the first substrate surface 110a.

This incoming light P1 is transmitted through the buffer layer 130 located at the first substrate surface 110a at the photodetection portion 120, and is transmitted to the light absorption layer 140 where it is absorbed. Since pairs of electrons and electron holes are generated through the absorption of the incoming light P1 at the light absorption layer 140, the incoming light P1 is sensed at the photodetection portion 120 as a result.

The semiconductor photodetector in this embodiment is considered to be ideally adopted as the semiconductor photodetector 100 that has been explained so far with respect to the cutoff frequency. However, the structure of the embodiment should not be limited to that of the semiconductor photodetector 100. The embodiment may be adopted in the semiconductor photodetectors whose schematic cross sections are presented in FIGS. 8–11, for instance.

Figure 8:
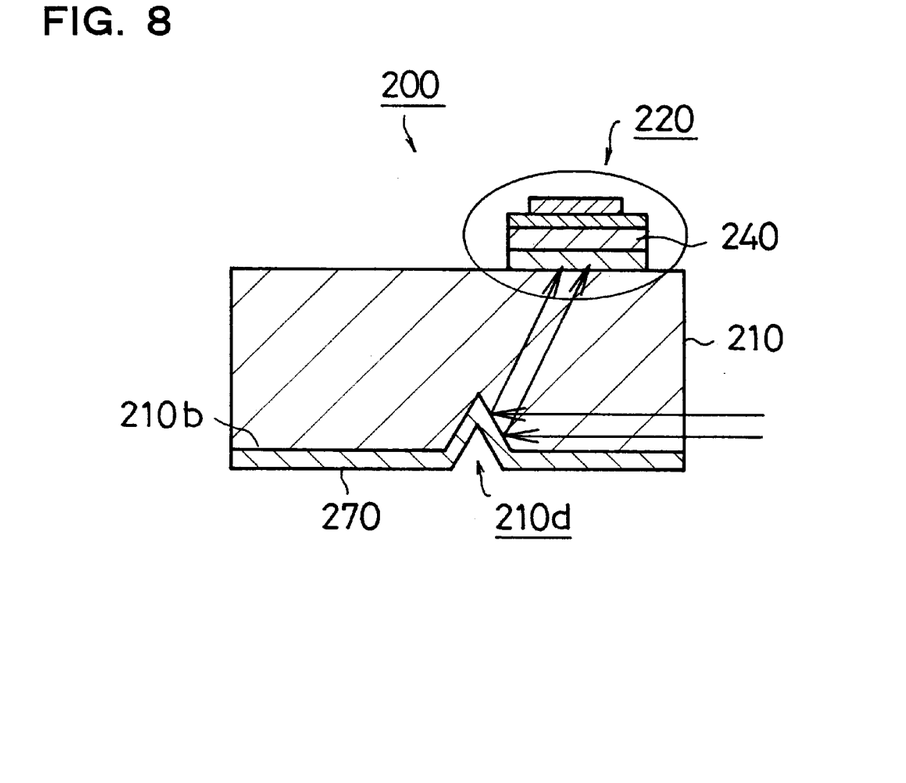
FIG. 8 is a schematic cross section illustrating another example of a semiconductor photodetector in which the present invention is adopted.

(2) While the semiconductor photodetector 100 illustrated in FIG. 7 adopts a structure achieved by using the semi-insulating substrate 110 and providing an electrodes 170a and 170b on the buffer layer 130 formed on the first substrate surface 110, the embodiment may be adopted in a semiconductor photodetector 200 illustrated in FIG. 8 which does not have these structural features. As illustrated in FIG. 8, the semiconductor photodetector 200 in the embodiment is achieved by using a substrate 210 constituted of $n^+$-InP and providing an electrode 270 on a second substrate surface 210b.

Since the electrode 270 can be mounted more easily at this semiconductor photodetector 200, the semiconductor photodetector 200 can be formed with a greater degree of ease compared to the semiconductor photodetector 100 illustrated in FIG. 7.

It is to be noted that the semiconductor photodetector 100 illustrated in FIG. 7, in which the distance between the light absorption layer 140 and the electrodes mounted at the substrate is smaller than that in the semiconductor photodetector 200, achieves a superior cutoff frequency due to higher speed at which the carrier is sent out from the light absorption layer 140.

Figure 9:
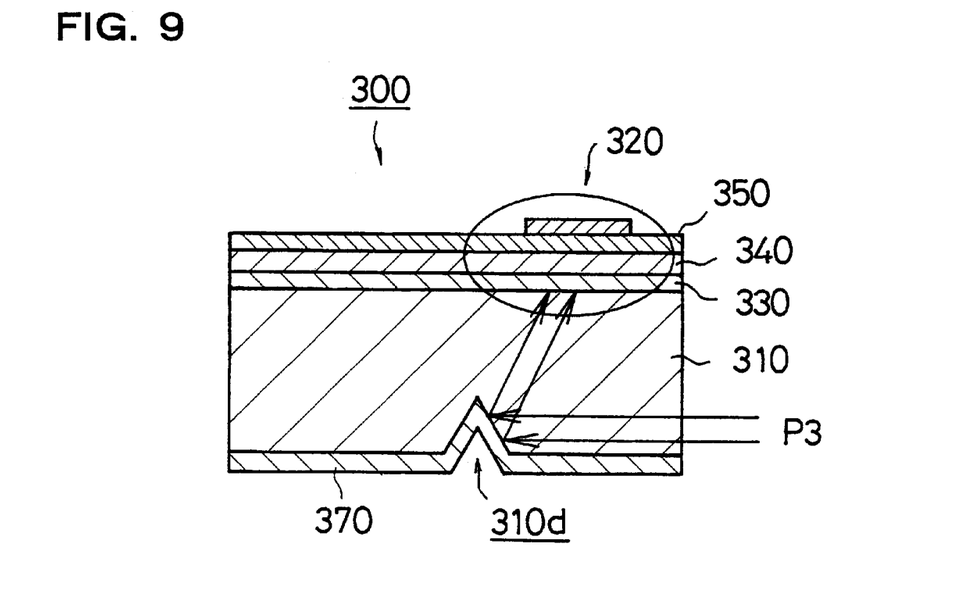
FIG. 9 is a schematic cross section illustrating yet another example of a semiconductor photodetector in which the present invention is adopted.

(3) In addition, while the semiconductor photodetector 200 illustrated in FIG. 8 adopts a structure in which the photodetection portion 220 is made to project out on the first substrate surface 210a through etching, the embodiment may be adopted in a semiconductor photodetector 300 illustrated in FIG. 9 which does not have these structural features. As illustrated in FIG. 9, in the semiconductor photodetector 300 in the embodiment, a photodetection portion 320 is formed by achieving partial complementarity between a cap layer 350 and a buffer layer 330 through selective diffusion of impurities at the cap layer 350. Since this semiconductor photodetector 300 does not require etching to be performed to project the photodetection portion out alone, the number of manufacturing steps can be reduced compared to the number of manufacturing steps required for manufacturing the semiconductor photodetector 200 illustrated in FIG. 8.

However, in the semiconductor photodetector 300, the cutoff frequency becomes degraded if light is absorbed at the light absorption layer 340 in areas other than the photodetection portion 320. This phenomenon, generally referred to as stray light, does not manifest in the semiconductor photodetector 200 illustrated in FIG. 8 in which the photodetection portion is formed alone. Thus, as far as the cutoff frequency is concerned, the semiconductor photodetector 200 illustrated in FIG. 8 is superior to the semiconductor photodetector 300 illustrated in FIG. 9.

Figure 10:
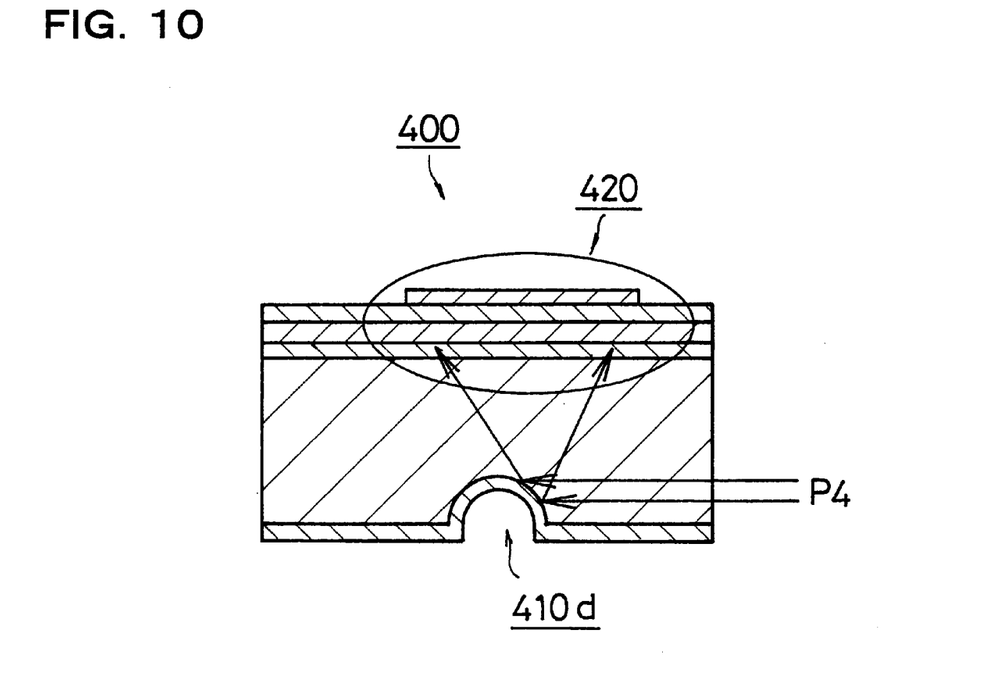
FIG. 10 is a schematic cross section illustrating yet another example of a semiconductor photodetector in which the present invention is adopted.

(4) Furthermore, while the semiconductor photodetector 300 in FIG. 9 adopts a structure in which a recess 310d having a forward mesa surface is formed, an embodiment may be adopted as shown in a semiconductor photodetector 400 illustrated in FIG. 10 which does not have these structural features. As illustrated in FIG. 10, in the semiconductor photodetector 400 in the embodiment, a recess 410d having a reverse mesa surface is formed.

In the semiconductor photodetector 400 having the recess 410d formed as a barrel-shaped groove with an approximately U-shaped cross section, an incoming light P4 is reflected over a wide angle at the recess. As a result, the semiconductor photodetector 300 illustrated in FIG. 9 requires a smaller area for the light absorption layer where light enters compared to the semiconductor photodetector 400 illustrated in FIG. 10. Consequently, the junction capacity at the photodetection portion in the semiconductor photodetector 300 illustrated in FIG. 9 can be kept lower than that at the semiconductor photodetector 400 illustrated in FIG. 10, which normally results in an improvement in the cutoff frequency. However, when the intensity of the incoming light is great enough to cause saturation at the light absorption layer, the cutoff frequency is improved to a greater degree in the photodetector 400 illustrated in FIG. 10 in which the incoming light is reflected over a wide angle so that the intensity of the light (the number of photons) can be reduced compared to the photodetector 300 illustrated in FIG. 9.

Figure 11:
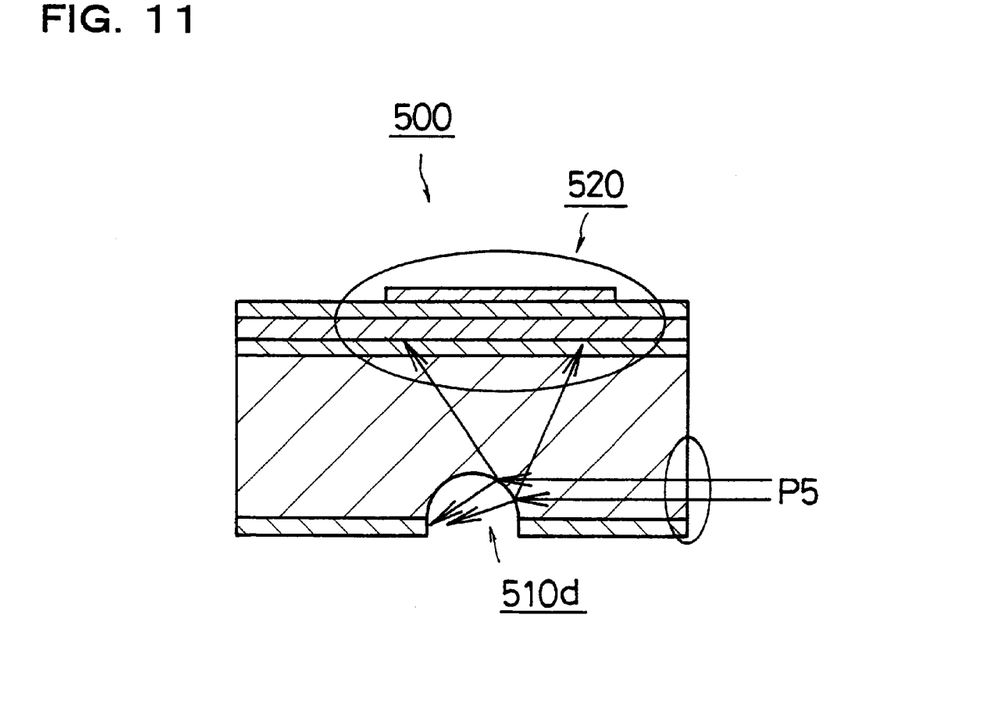
FIG. 11 is a schematic cross section illustrating yet another example of a semiconductor photodetector in which the present invention is adopted.

(5) Moreover, while the photodetector 400 illustrated in FIG. 10 adopts a structure achieved by coating a total reflection film onto the recess 410d, an embodiment may be adopted as shown in a semiconductor photodetector 500 illustrated in FIG. 11 which does not have these structural features. As illustrated in FIG. 11, since no special coating is implemented on a recess 510d in the semiconductor photodetector 500 in the embodiment, a reduction in the number of manufacturing steps is achieved.

It is to be noted that the reflection efficiency of incoming light is better in the semiconductor photodetector illustrated in FIG. 10 in which the mirror surface finish is implemented for the recess, compared to the semiconductor photodetector 500 illustrated in FIG. 11.

(B) As has been explained, the embodiment adopts a structure in which light is caused to enter through the substrate side into the photodetection portion by reflecting the light at the recess. Consequently, the simple pin structure may be adopted at the photodetection portion, and it is not necessary to achieve the waveguide structure at the photodetection portion. Thus, by adopting the embodiment, it becomes possible to keep down the cost for manufacturing the wafer.

In addition, since the photodetection surface is formed through cleavage in the embodiment, no wax, which is used when polishing the substrate, remains adhered to the photodetection surface. Consequently, there is no concern of a reduction in the photodetection efficiency occurring due to the presence of wax remaining at the photodetection surface.

Furthermore, in the embodiment, since the required depth at which the etching is implemented can be reduced by reducing the thicknesses of the light absorption layer and the cap layer at the photodetection portion, the wax can be removed easily after polishing the rear surface of the substrate (it is to be noted that in the semiconductor photodetector 100 explained earlier in reference to FIG. 1, the second substrate surface 110b of the substrate 110 is the equivalent of the rear surface of the substrate).

Moreover, in the embodiment, the tolerance characteristics can be improved by adjusting the shape of the photodetection portion, the shape and the depth of the recess, the forming position of the recess and the like that are parameters that can be set independently of each other. Thus, by adopting the embodiment, a great degree of freedom in designing a semiconductor photodetector can be assured.

In addition, in the embodiment, by setting the shape of the recess and the forming position of the recess as appropriate, it is possible to ensure that light enters approximately perpendicular relative to the surface of the light absorption layer toward the substrate. By ensuring that light enters approximately perpendicular relative to the surface of the light absorption layer toward the substrate, the need for taking into consideration any polishing error occurring while polishing the rear surface of the substrate is eliminated.

To further facilitate understanding of the geometry, when light enters a surface, the area of the surface relative to the amount of incident light increases as the angle of light entry becomes closer to 90 degrees. Thus, when the recess is formed to ensure that light enters approximately perpendicular to the surface of the light absorption layer toward the substrate, it becomes possible to achieve an extremely high degree of efficiency with which light enters the light absorption layer.

As a result, in the embodiment, the required size of the photodetection portion for achieving specific tolerance characteristics may be small. Namely, the junction capacity at the photodetection portion can be reduced, which results in an improvement in the cutoff frequency of the semiconductor photodetector.

It is to be noted that in a prototype of a semiconductor photodetector having the basic structural features of the embodiment, which was prepared by the inventor of the present invention et al., light entering through the side-entry surface of the substrate is reflected at a angle of 71.12 degrees at the recess to enter the photodetection portion.

Figure 12:
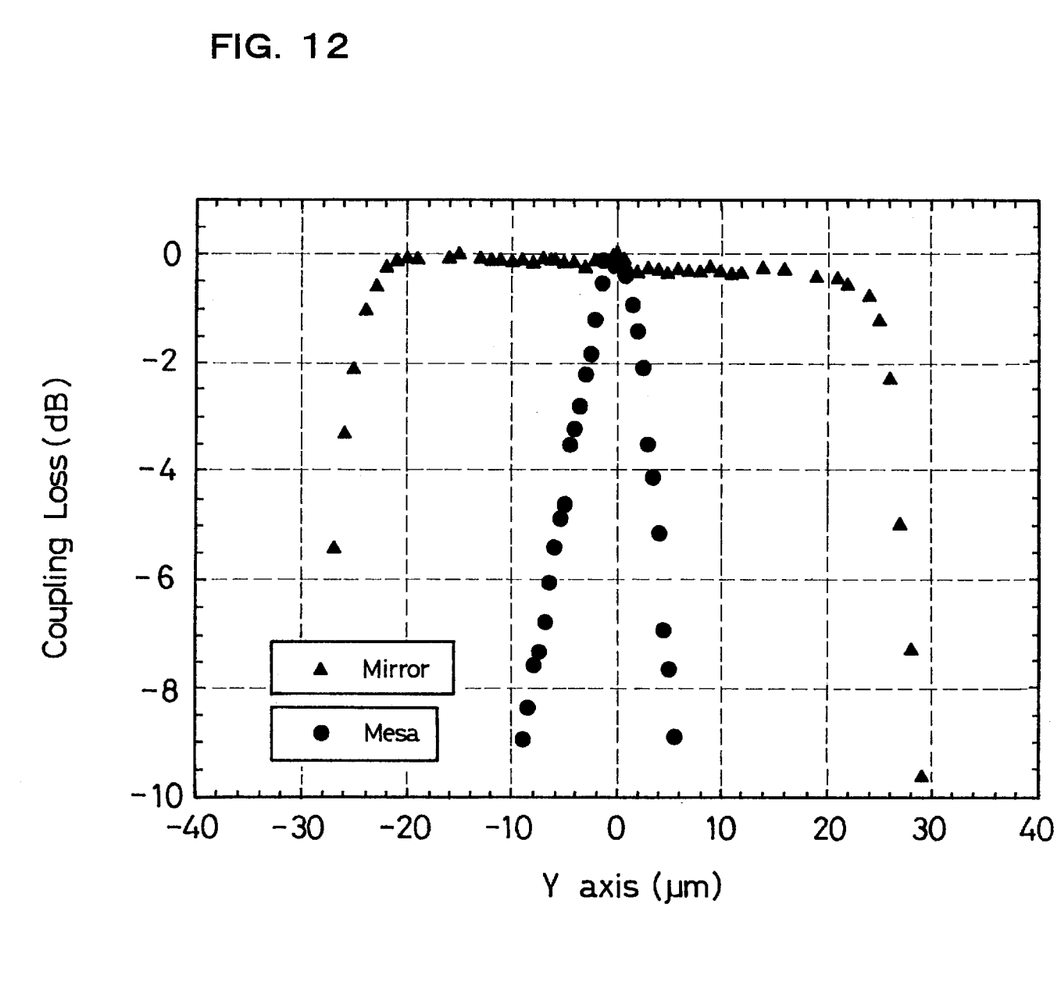
FIG. 12 presents test data in regard to a semiconductor photodetector adopting the present invention.
Figure 13:
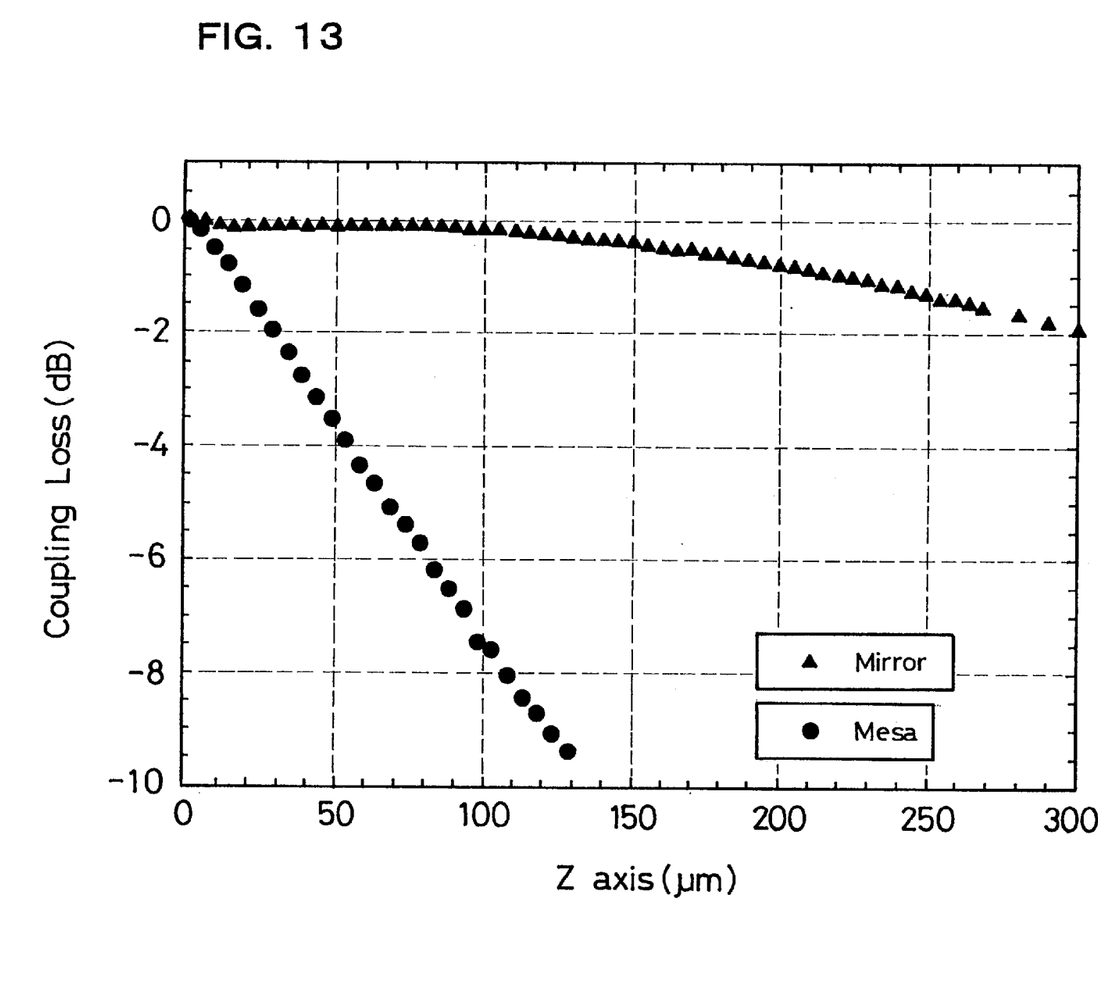
FIG. 13 presents further test data in regard to the semiconductor photodetector adopting the present invention.

FIGS. 12 and 13 present test data on the tolerance characteristics of the semiconductor photodetector having the basic structural features of the embodiment, which were measured by the inventor of the present invention et al. Specifically, FIG. 12 presents the results of a measurement of sensitivity (coupling loss: in "dB" units) relative to the misalignment in the direction of the Y axis (Y-axis; in "micro-meter" units), and FIG. 13 presents the results of measurements of sensitivity relative to misalignment in the direction of the Z axis (Z-axis; in "micro-meter" units).

As explained earlier, the direction of the Y axis is the direction of the width of the substrate and the direction of the Z axis is the direction of the depth of the substrate. In addition, in FIGS. 12 and 13, the results of measurements performed on the semiconductor photodetector in the embodiment are plotted using triangular dots (Mirror). Furthermore, in FIGS. 12 and 13, the results of measurements performed on a cleavage photodetection plane PD which was used for purposes of comparison are plotted in circular dots (Mesa).

As FIGS. 12 and 13 clearly indicate, the semiconductor photodetector in the embodiment ensures a sufficient degree of sensitivity over a wide range relative to misalignment in the Y direction or the Z direction. In other words, it is verified that the semiconductor photodetector in the embodiment demonstrates outstanding tolerance characteristics.

(C) While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, while the embodiment has been explained in reference to a semiconductor photodetector provided with a recess coated with a Cr/Au film, the present invention is not restricted to adopting this structure. The present invention, in fact, may be adopted in a semiconductor photodetector provided with a recess coated with a film selected from various metals such as Ag, Al and the like.

In addition, while the explanation has been given on an embodiment by referring to semiconductor photodetectors provided with a recess constituted of a wedge-shaped or a barrel-shaped groove-like indentation, the present invention is not restricted to adopting this structure. The present invention, in fact, may be adopted in a semiconductor photodetector provided with a recess formed in a shape selected from various other shapes.

Furthermore, while the explanation has been given on an embodiment by referring to semiconductor photodetectors with an InP semiconductor, the present invention is not restricted to adopting this structure. The present invention, in fact, may be adopted in a semiconductor photodetector with a semiconductor selected from various other types of semiconductors such as a GaAs semiconductor, a Si semiconductor or the like.

According to the present invention, a semiconductor photodetector that is inexpensive, does not require high precision alignment and still achieves a great improvement in the cutoff frequency characteristics is provided. Thus, by adopting the present invention, a flat mounting module with a high degree of reliability, which is capable of achieving a signal processing speed high enough to be employed in optical communication in, for instance, the 1 micro-meter band, can be realized at low cost. In addition, according to the present invention, the degree of freedom in designing a semiconductor photodetector increases. Thus, the semiconductor photodetector according to the present invention can be employed in an optical integrated circuit, an optical element module or the like without being subject to any restrictions with respect to its relationship with other optical elements.

The entire disclosure of Japanese Patent Application No. 10-92805 filed on Mar. 20, 1998 including specification, claims, drawings and summary is incorporated herein by reference in its entirety.

What is claimed is:

1. A semiconductor photodetector comprising:
a substrate having a first substrate surface facing in a first direction and a second substrate surface facing in a second direction opposite said first direction, wherein said substrate is adapted so as to transmit light between said first substrate surface and said second substrate surface;
a photodetection portion formed on said first substrate surface of said substrate for sensing light; and
a recess formed at said second substrate surface for reflecting the light transmitted through said substrate toward said photodetection portion, said recess comprising a groove having a U-shaped cross section.

2. The photodetector of claim 1, wherein said photodetection portion comprises a pin structure including a light absorption layer for absorbing light entering into said substrate, a first semiconductor layer, and a second semiconductor layer, said light absorption layer being sandwiched between said first semiconductor layer and said second semiconductor layer, and said first semiconductor layer and said second semiconductor layer being complementary.

3. The photodetector of claim 2, wherein said first semiconductor layer comprises a buffer layer, and said second semiconductor layer comprises a cap layer, said photodetection portion comprising a laminate structure formed by sequentially layering said buffer layer, said light absorbing layer, and said cap layer on said first substrate surface of said substrate.

4. The photodetector of claim 1, wherein said photodetection portion projects outwardly from said first substrate surface.

5. The photodetector of claim 1, further comprising a first electrode for external output formed at said first substrate surface, and a second electrode for external output formed at said photodetection portion.

6. The photodetector of claim 1, further comprising a first electrode for external output formed at said second substrate surface, and a second electrode for external output formed at said photodetection portion.

7. The photodetector of claim 1, further comprising a light reflection film formed at said recess.

8. The photodetector of claim 7, wherein said light reflection film comprises a total reflection metal film.

9. The photodetector of claim 7, wherein said light reflection film comprises a vapor-deposited metal film.

10. The photodetector of claim 7, wherein said recess has a forward mesa surface, said light reflection film being formed on said forward mesa surface.

11. The photodetector of claim 7, wherein said recess has a reverse mesa surface, said light reflection film being formed on said reverse mesa surface.

* * * * *